US006661687B1

United States Patent
Lien et al.

(10) Patent No.: US 6,661,687 B1
(45) Date of Patent: Dec. 9, 2003

(54) CAM CIRCUIT WITH SEPARATE MEMORY AND LOGIC OPERATING VOLTAGES

(75) Inventors: Chuen-Der Lien, Los Altos Hills, CA (US); Chau-Chin Wu, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/350,991

(22) Filed: Jan. 23, 2003

Related U.S. Application Data

(63) Continuation-in-part of application No. 10/164,981, filed on Jun. 6, 2002, now Pat. No. 6,512,685.

(51) Int. Cl.[7] .............................................. G11C 15/00
(52) U.S. Cl. .................... 365/49; 365/365; 365/154; 365/156; 365/189.07; 365/226
(58) Field of Search ...................... 365/43, 154, 156, 365/189.07, 226

(56) References Cited

U.S. PATENT DOCUMENTS

| 4,506,436 | A |   | 3/1985  | Bakeman, Jr. et al. |       |
|-----------|---|---|---------|---------------------|-------|
| 4,779,226 | A |   | 10/1988 | Haraszti            |       |
| 4,791,606 | A |   | 12/1988 | Threewitt et al.    |       |
| 4,876,215 | A |   | 10/1989 | Hsu                 |       |
| 5,483,479 | A |   | 1/1996  | Osawa et al.        |       |
| 5,561,429 | A |   | 10/1996 | Halberstam et al.   |       |
| 5,572,460 | A |   | 11/1996 | Lien                |       |
| 5,681,769 | A |   | 10/1997 | Lien                |       |
| 5,740,097 | A |   | 4/1998  | Satoh               |       |
| 5,901,085 | A |   | 5/1999  | Kramer et al.       |       |
| 6,005,790 | A |   | 12/1999 | Chan et al.         |       |
| 6,067,656 | A |   | 5/2000  | Rusu et al.         |       |
| 6,081,440 | A | * | 6/2000  | Washburn et al.     | 365/49 |
| 6,081,441 | A | * | 6/2000  | Ikeda               | 365/49 |
| 6,101,116 | A | * | 8/2000  | Lien et al.         | 365/49 |
| 6,128,207 | A |   | 10/2000 | Lien et al.         |       |
| 6,146,936 | A |   | 11/2000 | Manning             |       |
| 6,154,384 | A | * | 11/2000 | Nataraj et al.      | 365/49 |

* cited by examiner

Primary Examiner—Richard Elms
Assistant Examiner—Pho Luu
(74) Attorney, Agent, or Firm—Bever, Hoffman & Harms LLP

(57) ABSTRACT

A CAM circuit utilizes a relatively high operating voltage to control the memory portion of each CAM cell, and a relatively low operating voltage to control at least some of the logic portions of each CAM circuit. The CAM cell memory portion includes a memory (e.g., SRAM) cell controlled by a word line to store data values transmitted on complementary bit lines. The CAM cell logic portion includes a comparator that compares the stored data values with an applied data value transmitted on complementary data lines, and discharges a match line when the stored data value differs from the applied data value. The memory cell is driven using the relatively high memory operating voltage (e.g., 2.5 Volts) such that the stored charge resists soft errors. The complementary data lines and match line used to operate the comparator are driven using the relatively low logic operating voltage (e.g., 1.2 Volts) to conserve power.

26 Claims, 7 Drawing Sheets

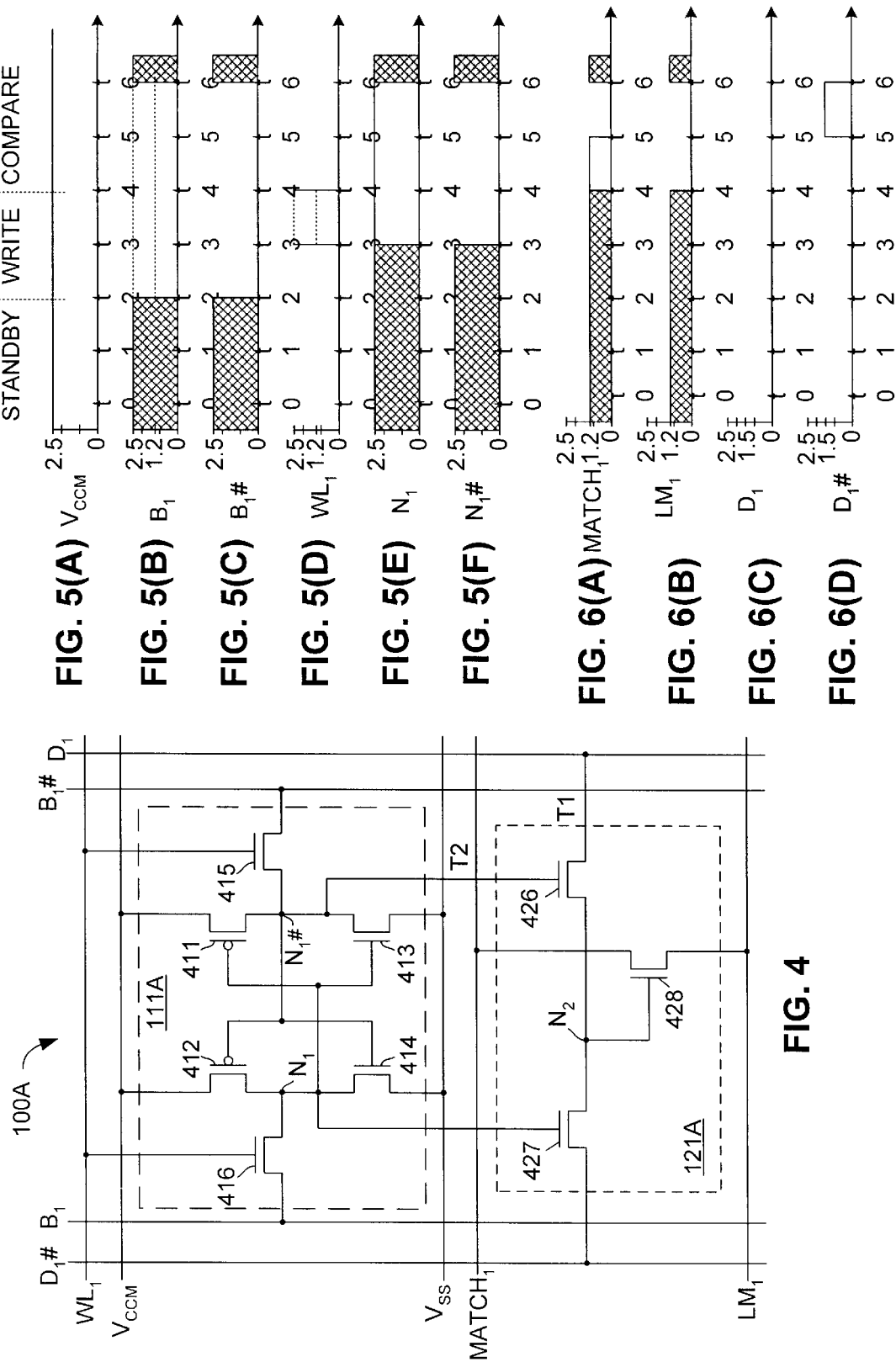

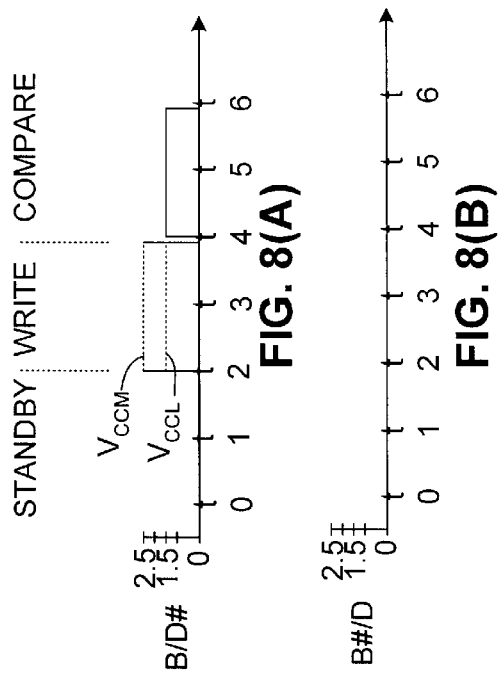
FIG. 8(A)
FIG. 8(B)
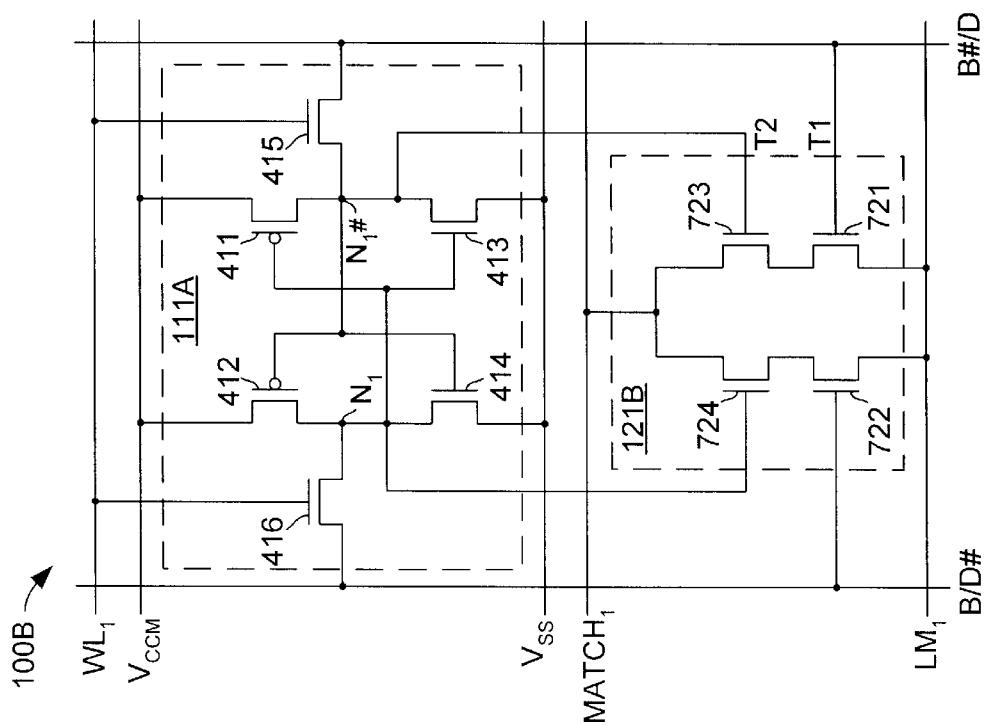
FIG. 7

CAM CIRCUIT WITH SEPARATE MEMORY AND LOGIC OPERATING VOLTAGES

RELATED APPLICATION

The present application is a continuation-in-part of commonly owned U.S. patent application Ser. No. 10/164,981, "CAM CIRCUIT WITH SEPARATE MEMORY AND LOGIC OPERATING VOLTAGES", filed Jun. 6, 2002 now U.S. Pat. No. 6,512,685 by Chuen-Der Lien and Chau-Chin Wu.

FIELD OF THE INVENTION

The present invention relates to integrated content addressable memory (CAM) arrays, and in particular to low-power CAM arrays.

DISCUSSION OF RELATED ART

Conventional random access memory (RAM) arrays include RAM cells (e.g., static RAM (SRAM) cells, dynamic RAM (DRAM) cells, and non-volatile RAM (NVRAM) cells) that are arranged in rows and columns, and addressing circuitry that accesses a selected row of RAM cells using address data corresponding to the physical address of the RAM cells within the RAM array. A data word is typically written into a RAM array by applying physical address signals to the RAM array input terminals to access a particular group of RAM cells, and applying data word signals to the RAM array input terminals that are written into the accessed group of RAM cells. During a subsequent read operation, the physical address of the group of RAM cells is applied to the RAM array input terminals, causing the RAM array to output the data word stored therein. Groups of data words are typically written to or read from the RAM array one word at a time. Therefore, a relatively small portion of the entire RAM array circuitry is activated at one time to perform each data word read/write operation, so a relatively small amount of switching noise occurs within the RAM array, and the amount of power required to operate the RAM array is relatively small.

In contrast to RAM arrays, content addressable memory (CAM) arrays store data values that are accessed in response to their content, rather than by a physical address. Specifically, during compare (search) operations, a CAM array receives a searched-for data value that is simultaneously compared with all of the data words stored in the CAM array. In response to each searched-for data value applied to the CAM array input terminals, the rows of CAM cells within the CAM array assert or de-assert associated match signals indicating whether or not one or more data values stored in the CAM cell rows match the applied data value. Therefore, large amounts of data can be searched simultaneously, so CAM arrays are often much faster than RAM arrays in performing certain functions, such as search engines.

While CAM arrays are faster than RAM arrays in performing search functions, they consume significantly more power and generate significantly more switching noise than RAM arrays. In particular, in contrast to RAM arrays in which only a small portion of the total circuitry is accessed during each read and write operation, significantly more power is needed (and noise is generated) in a CAM array because, during compare (search) operations, all of the CAM cells are accessed simultaneously, and those CAM cells that do not match the applied search data value typically switch an associated match line from a high voltage to a low voltage. Switching the large number of match lines at one time consumes a significant amount of power.

To reduce the total power consumed by CAM arrays, there is a trend toward producing CAM arrays that operate on low system (operating) voltages. To facilitate lower system voltages, the integrated circuit (IC) fabrication technologies selected to produce such CAM arrays utilize smaller and smaller feature sizes. In general, the smaller the feature size of an IC, the lower the operating voltage that is used to operate the IC. However, when IC feature sizes and operating voltages are reduced too much, the amount of charge stored at each node within the CAM array becomes so small that a "soft error" problem arises, which is discussed below with reference to FIG. 1.

FIG. 1 is a simplified cross sectional view showing an exemplary IC feature (e.g., a drain junction utilized to form an n-type transistor) that comprises an n-type diffusion (node) 50 formed in p-type well (P-WELL) 51, which in turn is formed in a p-type substrate 52. Dashed line capacitor 53 represents the capacitance of node 50, and indicates that node 50 stores a positive charge.

As indicated in FIG. 1, if an energetic particle, such as an alpha particle (a), from the environment or surrounding structure strikes the n-type diffusion of node 50, then electrons (e) and holes (h) will be generated within the underlying body of semiconductor material (i.e., in p-well 51 or p-type substrate 52). These free electrons and holes travel to the node 50 and p-well 51/p-substrate 52, respectively, thereby creating a short circuit current that reduces the charge stored at node 50. If the energy of the alpha particle is sufficiently strong, or if the capacitance 53 is too small, then node 50 can be effectively discharged. When node 50 forms a drain in an SRAM cell and the charge perturbation is sufficiently large, the stored logic state of the SRAM cell may be reversed (e.g., the SRAM cell can be flipped from-storing a logic "1" to a logic "0"). This radiation-produced data change is commonly referred to as a "soft error" because the error is not due to a hardware defect and the cell will operate normally thereafter (although it may contain erroneous data until rewritten).

Many approaches have been proposed for dealing with soft errors, such as increased cell capacitance or operating voltage, and error detection schemes (such as using one or more parity bits). While these proposed approaches are suitable for standard RAM arrays, they are less desirable in CAM arrays. As pointed out above, CAM arrays inherently consume more power than RAM arrays. Therefore, while increased cell size and/or operating voltage can be tolerated in a RAM array, such solutions are less desirable in a CAM arrays. Moreover, adding error detection schemes to CAM arrays increase the size (and, hence, the cost) of the CAM arrays, and further increase power consumption.

Accordingly, what is needed is a CAM circuit that addresses the soft error problem associated with the low power CAM operating environment without greatly increasing the cost and power consumption of the CAM circuit.

SUMMARY

The present invention is directed to a CAM circuit that addresses the soft error problem associated with the low power CAM operating environment by utilizing multiple operating voltages including a relatively high memory operating voltage that is used to power the memory cell of each CAM cell and, in some embodiments, to drive the memory portions of the CAM circuit, and a relatively low logic operating voltage to drive (control) at least some of the logic portions of the CAM circuit. Because the memory cell of each CAM cell in the CAM circuit is accessed relatively independently during, for example, write operations, the use of a relatively high operating voltage to store data values in these memory cells increases the amount of stored charge, thereby reducing the chance of "soft error" discharge, without significantly increasing power consumption of the overall CAM circuit. Conversely, because all of the logic portions (e.g., the comparators, match lines, data lines, and priority encoder) and of the CAM circuit are accessed/operated at the same time during compare operations, the use of a relatively low operating voltage to drive at least some of the logic portions reduces power consumption when compared with CAM circuits utilizing a single, relatively high voltage to drive all of the circuits of both the memory and the logic portions.

In accordance with a first embodiment of the present invention, the memory portion of each CAM cell includes a memory (e.g., SRAM) cell that is controlled by an associated word line to store a data value transmitted on complementary bit lines during read and write operations, and the logic portion of each CAM cell includes a comparator that compares the data values stored by the memory cell with an applied data value transmitted on complementary data lines, and discharges a match line when the stored data value differs from the applied data value. In this first embodiment, the memory cell is connected to a relatively high memory operating voltage (e.g., 2.5 Volts), thereby providing a relatively high stored charge that resists soft error discharge. In contrast, the match line control circuit of the CAM circuit, which is used to pull up the match line before each compare operation, is driven using a relatively low logic operating voltage (e.g., 1.2 to 1.5 Volts). The match line control circuit can either drive the low operating voltage onto the match line before each compare operation, or utilize the low operating voltage to couple the match line to some other voltage signal. The bit line control circuit and the word line control circuit used to control the memory cell during read and write operations are controlled using one of the relatively high memory operating voltage, the relatively low logic operating voltage, or an intermediate voltage (e.g., 1.8 Volts) that is between the high and low operating voltages. Similarly, one or more additional control circuits associated with the logic portions of the CAM cells (e.g., the data line control circuit, the low-match control circuit, and a priority encoder used to sense the voltage level on the match line during compare operations) may be driven using one of the relatively high memory operating voltage, the relatively low logic operating voltage, or an intermediate voltage that is between the high and low operating voltages. By utilizing a high operating voltage to maintain data values stored in the memory cells, and by driving the match lines using a relatively low operating voltage, the present invention provides a CAM circuit that both resists soft errors and facilitates lower power consumption than conventional CAM circuits utilizing a single, relatively high voltage to drive all of the circuits of both the memory and the logic portions.

In accordance with a second embodiment of the present invention, the memory cell of each CAM cell is connected to a relatively high memory operating voltage (e.g., 2.5 Volts), as in the first embodiment, and the data line control circuit of the CAM circuit is driven using a relatively low logic operating voltage (e.g., 1.2 to 1.5 Volts). The bit line control circuit, the word line control circuit, the match line and low-match line control circuits, and the priority encoder are controlled using one of the relatively high memory operating voltage, the relatively low logic operating voltage, or an intermediate voltage that is between the high and low operating voltages. However, to maximize power savings, circuits associated with the logic operations of the CAM cells (i.e., the match line and low-match line control circuits, and the priority encoder) are preferably driven using the low operating voltage. Similar to benefits provided by the first embodiment, maintaining a relatively high memory operating voltage while utilizing a relatively low operating voltage to perform data line control provides a CAM circuit that both resists soft errors and facilitates lower power consumption than conventional CAM circuits utilizing a single, relatively high operating voltage to drive all of the circuits of both the memory and the logic portions.

In accordance with a third embodiment of the present invention, the memory cell of each CAM cell is connected to a relatively high memory operating voltage (e.g., 2.5 Volts), as in the first and second embodiments, and the priority encoder of the CAM circuit is driven using a relatively low logic operating voltage (e.g., 1.2 to 1.5 Volts). The bit line control circuit, the word line control circuit, data line control circuit, and the match line and low-match line control circuits are controlled using one of the relatively high memory operating voltage, the relatively low logic operating voltage, or an intermediate voltage that is between the high and low operating voltages. However, similar to previous embodiments, the data line control circuit and the match line and low-match line control circuits are preferably driven using the low operating voltage to minimize power consumption. Similar to benefits provided by the first embodiment, maintaining a relatively high memory operating voltage to store data values while utilizing a relatively low operating voltage to sense and encode match line voltage signals during compare operations provides a CAM circuit that both resists soft errors and facilitates lower power consumption than conventional CAM circuits utilizing a single, relatively high operating voltage to drive all of the circuits of both the memory and the logic portions.

The present invention will be more fully understood in view of the following description and drawings.

BRIEF DESCRIPTION OF THE DRAWINGS

FIG. 4 is a schematic diagram showing a CAM cell of the CAM circuit shown in FIG. 3 in accordance with a first specific embodiment of the present invention;

FIGS. 5(A) through 5(F) are timing diagrams depicting simplified operations of a memory portion of the CAM cell shown in FIG. 4;

FIGS. 6(A) through 6(D) are timing diagrams depicting simplified operations of a logic portion of the CAM cell shown in FIG. 4;

FIG. 7 is a schematic diagram showing a CAM cell of a CAM array according to a second specific embodiment of the present invention;

FIGS. 8(A) and 8(B) are timing diagrams depicting simplified bit/data line operations of the CAM cell shown in FIG. 7.

DETAILED DESCRIPTION

The present invention is described below with specific reference to binary SRAM CAM cells and ternary DRAM CAM cells. However, it is noted that the present invention can be extended to include other types of CAM cells, including ternary and quad (four-state) SRAM CAM cells, and binary and quad DRAM CAM cells. Accordingly, the specific CAM cell embodiments described herein are intended to be exemplary, and not limiting (unless otherwise specified in the claims).

Figure 2:
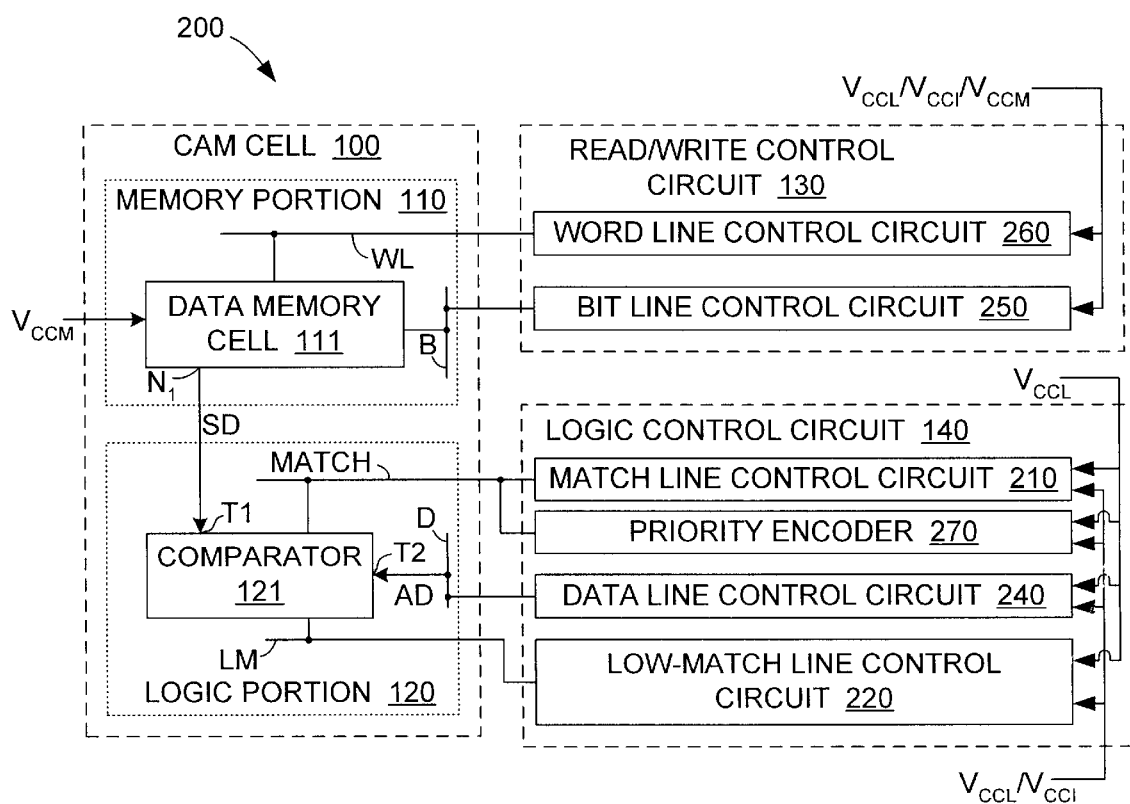
FIG. 2 is a block diagram showing a portion of a CAM circuit according to an embodiment the present invention.

FIG. 2 is a block diagram showing part of a CAM circuit 200 including a simplified CAM cell 100. CAM cell 100 is divided for descriptive purposes into a memory portion 110 and a logic portion 120 that are fabricated using known fabrication (e.g., CMOS) techniques. Memory portion 110 includes a memory cell 111 that is controlled by a word line WL to store a data value transmitted on a bit line B during a write operation, and transmits the stored data value SD from a storage node $N_1$ to logic circuit 120 during compare operations. Logic circuit 120 includes a comparator 121 that receives stored data value SD at a first terminal Ti, and compares stored data value SD with an applied data value AD transmitted on a data line D and received at a second terminal T2. When stored data value SD differs from applied data value AD, comparator 121 opens a path between a pre-charged match line MATCH and a discharge line LM, thereby causing a previously applied charge on the match line to discharge. Conversely, when stored data value SD is the same as applied data value AD (e.g., both SD and AD are logic "1"), the path between match line MATCH and discharge line LM remains closed, thereby maintaining the pre-charge on match line MATCH. Note that, in accordance to alternative embodiments that detect match/no-match conditions using other possible conventions, the match line may be charged instead of discharged in response to the no-match condition, or may be discharged in response to a match condition. Although the following specific embodiments describe a no-match/discharge convention, the present invention is also applicable to these alternative conventions. Note also that, as used herein, a path is "open" when a conductive condition exists (i.e., a closed circuit), whereas a path is "closed" when a non-conductive condition exists (i.e., an open circuit).

Referring to the right side of CAM cell 100 in FIG. 2, CAM circuit 200 also includes a read/write control circuit 130 and a logic control circuit 140. Read/write control circuit 130 includes several control circuits that operate according to well known methods to control memory cell 111 of CAM cell 100 during data read and data write (read/write) operations 110. In the embodiment shown in FIG. 2, read/write control circuit 130 includes (but is not limited to) a word line control circuit 250 for controlling a voltage signal transmitted on word line WL during read/write operations, and a bit line control circuit 260 for controlling a voltage signal transmitted on bit line B during read/write operations. Logic control circuit 140 includes several control circuits that operate according to known methods to perform compare (a.k.a., "lookup" or "match") operations associated with logic portion 120 of CAM cell 100. In the embodiment shown in FIG. 2, read/write control circuit 130 includes (but is not limited to) a match line control circuit 210, an optional low-match line control circuit 220, a data line control circuit 240, and a priority encoder 270. These circuits are described in additional detail below. Read/write control circuit 130 and logic control circuit 140 are arranged and constructed according to know techniques.

Figure 1:
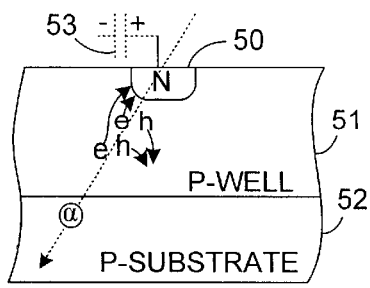
FIG. 1 is simplified cross sectional view showing a node of an IC device.

According to the present invention, memory cell 111 of each CAM cell 100 is either connected to (or selectively coupled to) a relatively high memory (first) operating voltage $V_{CCM}$ (e.g., 2.5 Volts) to prevent soft errors, while one or more portions of logic control circuit 140 are connected to a relatively low logic (second) operating voltage $V_{CCL}$ (e.g., 1.2 to 1.5 Volts) to minimize power consumption. In particular, read/write control circuit 130 controls memory cell 110 such that storage node $N_1$ is selectively coupled to relatively high memory operating voltage $V_{CCM}$ (e.g., when a logic "1" is written to memory cell 111) such that a charge stored at memory cell 111 has a relatively high value. For example, when memory cell 111 is an SRAM cell, read/write control circuit 130 includes a voltage source that latches storage node $N_1$ to memory operating voltage $V_{CCM}$, which is supplied to memory cell 11 as indicated on the left side of FIG. 2, during a logic "1" write operation. Alternatively, when memory cell 111 is a DRAM cell, read/write control circuit 130 includes a bit line control circuit that transmits memory operating voltage $V_{CCM}$ to storage node $N_1$ during a logic "1" write operation (i.e., the $V_{CCM}$ source shown on the left side of FIG. 2 is not needed). These examples are described in additional detail below. In contrast to the high operating voltage utilized in memory cell 111, one or more portions of logic control circuit 140 (e.g., match line control circuit 210, as shown in FIG. 2) is connected to (i.e., driven by) relatively low logic operating voltage $V_{CCL}$. By driving, for example, match line control circuit 210 using the relatively low logic operating voltage $V_{CCL}$, the power consumption associated with the operation of logic portion 120 of CAM cell 100 can be significantly reduced. For example, by configuring match line control circuit 210 to couple match line MATCH to the relatively low logic operating voltage $V_{CCL}$ before each compare operation, significantly less power is consumed during compare operations than if match line MATCH were coupled to relatively high memory operating voltage $V_{CCM}$ (i.e., assuming discharge line LM is held at the same discharge value). Accordingly, by utilizing relatively high memory operating voltage $V_{CCM}$ to store data values in memory cell 111 of each CAM cell 100, and by utilizing relatively low memory operating voltage $V_{CCL}$ to perform at least one of the logic operations provided by logic control circuit 140, the present invention provides a CAM circuit that both minimizes the chance of the "soft error" discharge events that are described above with reference to FIG. 1, and reduces power consumption when compared with conventional CAM circuits utilizing a single, relatively high operating voltage.

As utilized herein, the term "operating voltage" is used herein to refer to a system voltage either externally supplied to CAM circuit 100, or a system voltage generated by one or more discrete voltage source circuits incorporated into CAM cell 100. For example, memory voltage source $V_{CCM}$ may be supplied from and external source, or may be generated by an "on-chip" voltage source circuit using a higher (or lower) external voltage source according to known techniques. Similarly, logic voltage source $V_{CCL}$ may be supplied from and external source, or may be generated by an "on-chip" voltage source circuit. Moreover, both memory voltage source $V_{CCM}$ and logic voltage source $V_{CCL}$, as well as one or more intermediate voltages mentioned below, may be generated by the same "onchip" voltage source circuit using well known techniques.

According to an aspect of the present invention, both maximum "soft error" resistance and maximum power conservation are achieved when relatively high memory voltage source $V_{CCM}$ is supplied only to those read/write control circuits needed to store memory voltage source $V_{CCM}$ at a corresponding memory cell (i.e., when a logic "1" is written to that memory cell), and relatively low logic voltage source $V_{CCL}$ is supplied to all other control circuitry of the CAM circuit. For example, when memory cell 111 is an SRAM cell and memory voltage source $V_{CCM}$ is supplied to memory cell 111 as indicated on the left side of FIG. 2, then all portions of read/write control circuit 130 and logic control circuit 140 may be driven using relatively low logic voltage source $V_{CCL}$ to minimize power consumption. Conversely, when memory cell 111 is a DRAM cell, then at least some portions of read/write control circuit 130 must be driven using relatively high memory voltage source $V_{CCM}$ to selectively transfer this high voltage to storage node $N_1$.

Although maximum power conservation is achieved when logic voltage source $V_{CCL}$ is utilized to drive read/write control circuit 130 and logic control circuit 140, it is readily understood that at least some reduction in power consumption can be obtained by driving at least some of these control circuits using relatively low logic voltage source $V_{CCL}$ (e.g., 1.2 to 0 1.5 Volts), while other portions of CAM circuit 100 are driven using relatively high memory voltage source $V_{CCM}$ (e.g., 2.5 Volts), or using an intermediate voltage source $V_{CCI}$ (e.g., 1.8 Volts) that is between memory voltage source $V_{CCM}$ and logic voltage source $V_{CCL}$. Therefore, as indicated in FIG. 2, in accordance with another aspect of the present invention, both bit line control circuit 250 and word line control circuit 260 are driven using any of logic voltage source $V_{CCL}$, memory voltage source $V_{CCM}$, and intermediate voltage source $V_{CCI}$. Similarly, although at least one portion of logic control circuit 140 (e.g., match line control circuit 210, data line control circuit 240, or priority encoder 270) is driven using logic voltage source $V_{CCL}$ to reduce power consumption, one or more other portions may be driven using memory voltage source $V_{CCM}$ or intermediate voltage source $V_{CCI}$. These aspects are further described with reference to certain specific embodiments set forth below.

Figure 3:
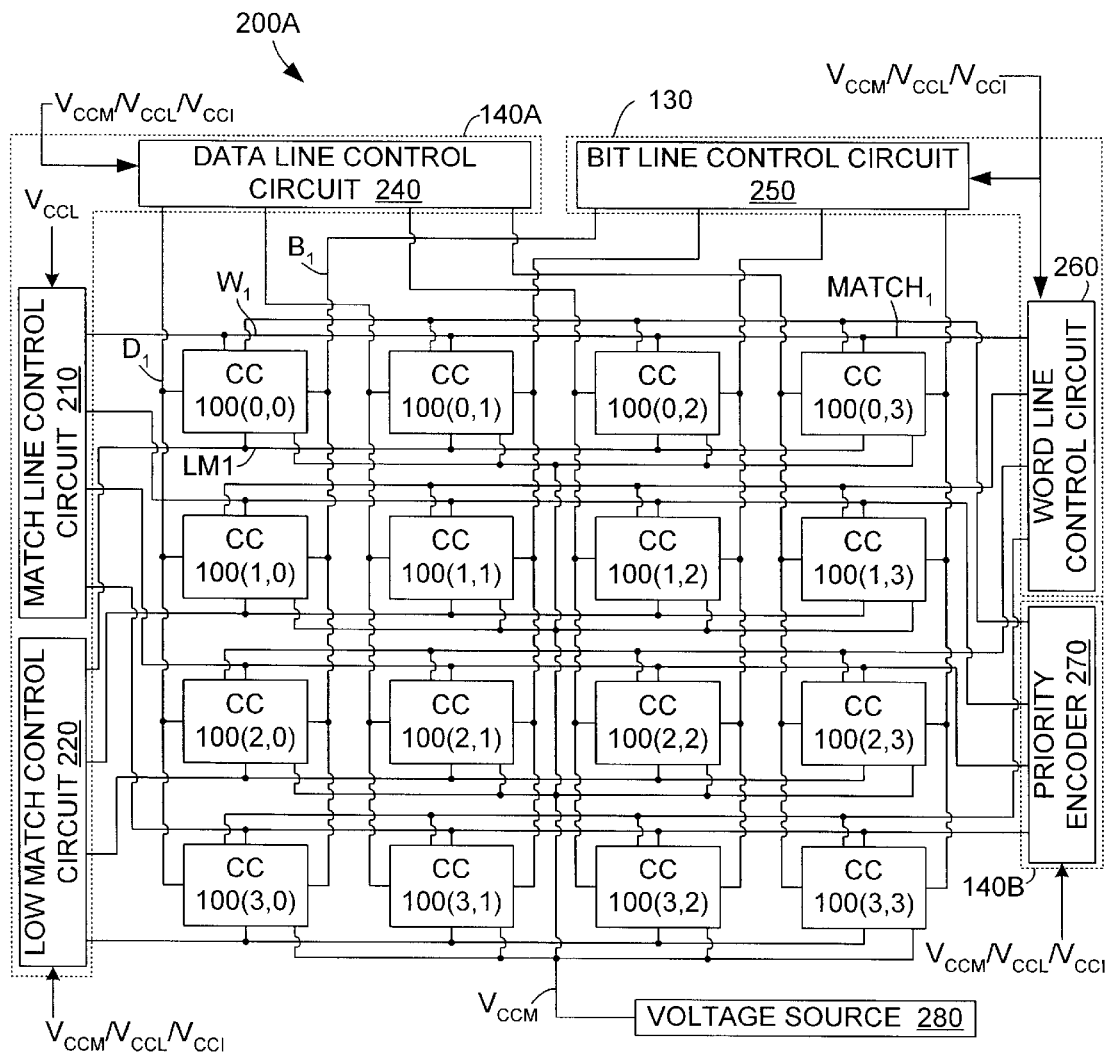
FIG. 3 is a simplified diagram showing the CAM circuit of FIG. 2 in additional detail.

FIG. 3 is a schematic diagram showing CAM circuit 200 in additional detail and arranged in accordance with a specific embodiment of the present invention. In particular, CAM circuit including CAM cells (CC) 100(0,0) through 100(3,3) that are arranged in rows and columns. Each CAM cell 100(0,0) through 100(3,3) is essentially identical to CAM cell 100 (see FIG. 2). Each column of CAM cells (e.g., cells 100(0,0) through 100(3,0)) is connected to an associated data line (e.g., data line $D_1$) and an associated bit line (e.g., bit line $B_1$), although in at least one embodiment described herein the data lines and bit lines are combined. The bit lines are used to transmit data values to the data memory cells (i.e., data memory cell 111; see FIG. 2) of each CAM cell in the associated column during data write operations. The data lines are used to transmit applied data values to the logic circuit (i.e., comparator 121 see FIG. 2) of each CAM cell in the associated column during comparison operations. Similarly, each row of CAM cells (e.g., cells 100(0,0) through 100(0,3)) is connected to an associated match line (e.g., data line $MATCH_1$), an associated low match (discharge) line (e.g., low match line $LM_1$), and an associated word line (e.g., low match line $W_1$). The word lines are used to address the data memory cells of each CAM cell in the associated row during data write operations. The match line associated with each row of CAM cells is discharged to the associated low match line in the manner described above when any of the CAM cells in the row detect a no-match condition between the applied data value on the associated data line and the stored (first) data value in that CAM cell. Stated differently, when any CAM cell in a given row (e.g., any of CAM cells 100(0,0), 100(0,1), 100(0,2), and 100(0,3)) detects a no-match condition, then the associated match line (e.g., match line $MATCH_1$) is discharged to the associated low match line (e.g., low match line $LM_1$). Note that sixteen CAM cells are used in the present embodiment for descriptive purposes, and actual CAM arrays typically include several thousand CAM cells. Further, additional circuitry associated with CAM circuit 200 (e.g., input/output circuitry) is omitted from the simplified description for brevity. Note that this additional circuitry can either by driven using the relatively high memory operating voltage $V_{CCM}$, by the relatively low logic operating voltage $V_{CCL}$, or by intermediate voltage source $V_{CCI}$.

As discussed above, CAM circuit 200A also includes a read/write control circuit 130 and a logic control circuit 140. In the embodiment disclosed in FIG. 3, logic control circuit 140 includes a first portion 140A, which includes match line control circuit 210, low match control circuit 220, and data line control circuit 240, and a second portion 140B, which includes priority encoder circuit 270. As indicated at the top of FIG. 3, read/write control circuit 130 includes bit line control circuit 250 and word line control circuit 260. As indicated at the bottom of FIG. 3, CAM circuit 200A also includes a memory voltage source 280.

According to the specific embodiment shown in FIG. 3, the memory cell of each CAM cell 100(0,0) through 100(0, 3)) is connected to the relatively high voltage source $V_{CCM}$, which in this case is generated by memory voltage source 280, and match line control circuit 210 is driven using the relatively low logic operating voltage $V_{CCL}$. The remaining control circuits of CAM circuit 200A are driven using any of the relatively high memory operating voltage $V_{CCM}$, the relatively low logic operating voltage $V_{CCL}$, or intermediate voltage source $V_{CCI}$. Specifically, referring to the upper right portion of FIG. 3, read/write control circuit portion 130 is either driven using relatively high memory operating voltage $V_{CCM}$, using the relatively low logic operating voltage $V_{CCL}$, or using an intermediate operating voltage $V_{CCI}$. Bit line control circuit 250 transmits data signals to selected bit lines (e.g., data line $B_1$) during data write operations. In SRAM-based embodiments, these data signals can either be memory operating voltage $V_{CCM}$, logic operating voltage $V_{CCL}$ or intermediate operating voltage $V_{CCI}$ when the transmitted data values is, for example logic "1", or ground ($V_{SS}$) when the transmitted data value is, for example, logic "0". However, in DRAM-based embodiments, these data signals must be memory operating voltage $V_{CCM}$ when the transmitted data values is, for example logic "1", and ground ($V_{SS}$) when the transmitted data value is, for example, logic "0". Finally, word line control circuit 260 transmits address signals to selected word lines (e.g., word line $W_1$) during data write operations. Similar to bit line control circuit 250, the signals generated by word line control circuit 260 can either be memory operating voltage $V_{CCM}$, logic operating voltage $V_{CCL}$ or intermediate operating voltage $V_{CCI}$ when the word line is selected, or ground ($V_{SS}$) when the word line is not selected.

Referring to the lower right portion of FIG. 3, voltage source 280 applies memory operating voltage $V_{CCM}$ to each SRAM CAM cell 100(0,0) through 100(3,3) of the CAM array in the manner described below with reference to the specific embodiments. Note again that separate voltage source 280 is not needed in DRAM-based embodiments.

Note that in either SRAM-based or DRAM-based embodiments, storage node $N_1$ is coupled to memory operating voltage $V_{CCM}$ during write operations (i.e., when a logic "1" is written to a selected memory cell). In SRAM-based embodiments, this coupling is between storage node $N_1$ and voltage source 280 (i.e., the SRAM cell is latched such that storage node $N_1$ is coupled to voltage source 280). In DRAM-based embodiments, this coupling is generated by selectively coupling storage node $N_1$ to bit line B, which is pulled up to memory operating voltage $V_{CCM}$. Therefore, in either embodiment, a relatively high charge is stored by memory cell 111, thereby facilitating resistance to soft error discharge. Further, because the memory cells 100(0,0) through 100(3,3) are accessed relatively independently (i.e., only one or a small group of memory cells is accessed at any given time) during, for example, write operations, the use of a relatively high memory operating voltage $V_{CCM}$ to drive the memory portion of CAM circuit 200 does not significantly increase power consumption.

Referring to the upper left portion of FIG. 3, in one embodiment, match line control circuit 210 generates a pre-charge equal to logic operating voltage $V_{CCL}$ on each of several match lines (e.g., match line $MATCH_1$) in accordance with the comparison operation described below. In addition, low match control circuit 220 controls the low match lines (e.g., low match line $LM_1$) such that they float during non-active periods, and are pulled down to a pre-determined low voltage (e.g., 0 volts or some low positive voltage generated according to known techniques) during compare operations. In an alternative embodiment, low match line $LM_1$ may be maintained at 0 volts at all times. Data line control circuit 240 transmits applied data signals to selected data lines (e.g., data line $D_1$) during compare operations. Finally, referring to the lower portion of FIG. 3, priority encoder circuit 270 is controlled using one of the indicated logic operating voltages to sense (measure) and identify the charged/discharged state of the match lines during compare operations, and passes the resulting match line information to associated control circuitry (not shown). Because the logic portions of CAM cells 100(0,0) through 100(3,3) are accessed at the same time during compare operations, the use of the relatively low logic operating voltage $V_{CCL}$ to drive match line control circuit 210 of CAM circuit 200 prevents high power consumption. Accordingly, using at least two different operating voltages to drive the memory portions and logic portions of each CAM cell in CAM circuit 200 facilitates both a reduction in "soft error" discharge, and a reduction in the overall power consumption of the CAM circuit.

Those familiar with CAM circuits will recognize that the sixteen CAM cells depicted in the embodiment shown in FIG. 3 are provided solely for descriptive purposes, and that actual CAM arrays typically include several thousand CAM cells. Further, the specific control circuits depicted in the embodiment shown in FIG. 3 are intended to be exemplary, and not limiting. For example, those familiar with CAM circuits will recognize that additional circuitry associated with the operation of CAM circuit 200 (e.g., input/output circuitry) is omitted from the simplified embodiment shown in FIG. 3. Such circuitry is omitted from description solely for the sake of brevity. Note that such additional circuitry can either by driven using the relatively high memory operating voltage $V_{CCM}$, the relatively low logic operating voltage $V_{CCL}$, or the intermediate operating voltage $V_{CCI}$.

The operation of CAM circuits produced in accordance with the present invention is described below with respect to specific embodiments of CAM cell 100. Note that the disclosed specific embodiments are intended to be illustrative, and not limiting.

FIG. 4 is a schematic diagram showing a CAM cell 100A in accordance with a first specific embodiment of the present invention. Similar to CAM cell 100 (see FIG. 2), CAM cell 100A includes an SRAM cell 111A and a comparator 121A. SRAM cell 111A is connected to complementary bit lines $B_1$ and $B_1\#$ ("#" is used herein to denote an inverted signal), word line WL, memory operating voltage $V_{CCM}$ (i.e., from voltage source 280; see FIG. 3), and a (ground) $V_{SS}$ voltage supply source. Comparator 121A is connected to complementary data lines $D_1$ and $D_1\#$, low match line $LM_{-1}$, and match line $MATCH_1$.

Referring to the upper portion of FIG. 4, SRAM cell 111A includes p-channel transistors 411 and 412 and n-channel transistors 413–416, which are fabricated according to known techniques. Transistors 411 and 413 are connected in series between the $V_{CCM}$ operating voltage and the $V_{SS}$ voltage supply source, and transistors 412 and 414 are also connected in series between $V_{CCM}$ and $V_{SS}$. Transistors 411 and 413 and transistors 412 and 414 of SRAM cell 111A are cross-coupled to form a storage latch. Specifically, a first storage node $N_{12}\#$ that is located between transistors 411 and 413 is connected to the gate terminals of transistors 412 and 414, and a second storage node $N_1$ that is located between transistors 412 and 414 is connected to the gate terminals of transistors 411 and 413. Access transistor 415 is connected between bit line $B_1\#$ and node $N_1\#$. Access transistor 416 is connected between bit line $B_1$ and node $N_1$. The gates of access transistors 415 and 416 are connected to word line $WL_1$. Note that SRAM cell 111A only stores a single data value (bit) that is either a logic high value is maintained at node $N_1$ (i.e., node $N_1$ is coupled to memory voltage signal $V_{CCM}$)) and a low voltage signal ($V_{SS}$) is maintained at inverted node $N_1\#$), or a logic low value (e.g., a low voltage signal ($V_{SS}$) is maintained at node $N_1$ and a high voltage signal ($V_{CCM}$) is maintained at inverted node $N_1\#$).

Referring to the lower portion of FIG. 4, comparator 121A includes n-channel transistors 426, 427 and 428. Transistor 428 is connected between match line $MATCH_1$ and low match line $LM_1$. Transistor 426 has a first terminal connected to data line $D_1$, a gate terminal connected to inverted node $N_1\#$, and a second terminal connected to a node $N_2$, which is connected to the gate terminal of transistor 428. Transistor 427 has a first terminal connected to inverted data line $D_1\#$, a gate terminal connected to node $N_1$, and a second terminal connected to node $N_2$. With this arrangement, transistor 428 is turned on to provide a path between match line $MATCH_1$ and low match line $LM_1$ when either (a) the data value stored at inverted node $N_1\#$ and transmitted on data line $D_1$ are high (i.e., $V_{CCM}$ and $V_{CCL}$, respectively), or (b) the data value stored at node $N_1$ and transmitted on inverted data line $D_1\#$ are high (i.e., $V_{CCM}$ and $V_{CCL}$, respectively). Under either of these conditions, a high voltage (i.e., $V_{CCL}$) is applied to the gate terminal of transistor 428, thereby turning on this transistor and coupling match line $MATCH_1$ with low match line $LM_1$.

Examples of standby, write and compare operations of CAM cell 100A will now be described with reference to the timing diagrams depicted in FIGS. 5(A) through 5(F) and FIGS. 6(A) through 6(D). FIGS. 5(A) through 5(F) depict signals generated in the memory portion of CAM cell 100A during a time period spanning time t0 through t6, and FIGS. 6(A) through 6(D) depict signals generated in the logic portion of CAM cell 100A during the same period. In this time period, time t0 to t2 represents a standby period, time t2 through t4 apply to a data write operation, and time t4 to t6 apply to a compare operation. The times indicated in these timing diagrams are simplified for descriptive purposes.

As indicated in FIG. 5(A), a relatively high constant operating voltage $V_{CCM}$ (e.g., 2.5 Volts) is applied to the first terminals of transistors 411 and 412. As described above with reference to FIG. 3, this constant operating voltage $V_{CCM}$ is transmitted to each SRAM cell from voltage supply 280. In the present example, $V_{SS}$ is maintained at 0 Volts.

In a standby operation (time t0 through t2), word line $WL_1$ (FIG. 5(D)) and data lines $D_1$ and $D_1\#$ (FIGS. 6(C) and 6(D), respectively) are pulled down to logic low (0 Volts) values, thereby turning off transistors 415, 416, and 428. As indicated by the cross-hatched region, the signal transmitted on bit line $B_1$ (FIG. 5(B)), inverted bit line $B_1\#$ (FIG. 5(C)) match line $MATCH_1$ (FIG. 6(A)), and low match line $LM_1$ (FIG. 6(B)) does not matter (i.e., can be either high or low). Similarly, the value stored at node $N_1$ (FIG. 5(E)) and inverted node $N_1\#$ (FIG. 5(F)) does not matter.

A write operation, during which a logic "1" (i.e., high) data value is written to SRAM cell 11A between time t2 and t4, will now be described. As indicated by the dashed lines in FIG. 5(B), bit line $B_1$ is maintained at either memory operating voltage $V_{CC}$5 Volts) or logic operating voltage $V_{CCL}$ (e.g., 1.2 Volts) (or some intermediate voltage) during the write operation. Note that either of operating voltages $V_{CCM}$ or $V_{CCL}$ may be utilized, and the selection of either operating voltage is based, for example, on circuit design convenience. As indicated in FIG. 5(C), inverted bit line $B_1\#$ is maintained at $V_{SS}$ throughout the write operation. Referring to FIG. 5(D), at time t3 (i.e., after bit line $B_1$ and inverted bit line $B_1\#$ are stable), word line $WL_1$ is pulled up to $V_{CCM}$ (or $V_{CCL}$) to turn on transistors 415 and 416, thereby passing the logic values from bit lines $B_1\#$ and $B_1$, respectively, to the latch formed by transistors 411–414. As indicated in FIGS. 5(E) and 5(F), this write operation causes the latch to maintain a logic high or $V_{CCM}$ value (2.5 Volts) at node $N_1$, and a logic low or $V_{SS}$ value (0 Volts) at inverted node $N_1\#$. Note that data lines $D_1$ and $D_1\#$ (FIGS. 6(C) and 6(D)) are held to logic low values, thereby turning off transistor 428 no matter what value is stored at node $N_1$ and inverted node $N_1\#$. Although not shown in the figures, to write a logic low value to SRAM cell 111A, bit line $B_1$ is held to a logic low value and bit line $B_1\#$ is held to a logic high value when word line $WL_1$ turns on transistors 115 and 116, thereby pulling up inverted node $N_1\#$ to a logic high value and pulling down node $N_1$ to a logic low value in a manner similar to that described above.

A compare operation (time t4 to t6) will now be described during which a logic "0" (i.e., low) data value is applied to comparator 121A. As shown in FIG. 6(A), at time t4 match line $MATCH_1$ is pre-charged to the logic operating voltage $V_{CCL}$ (e.g., 1.2 Volts). Both low match line $LM_1$ (FIG. 6(B)) and word line $WL_1$ (FIG. 5(D) are held at logic low values at this time. The data values on bit lines $B_1$ and $B_1\#$ (FIGS. 5(B) and 5(C)) are not utilized in the compare operation, and are therefore left in their previous states. In the present example, a "match" condition is indicated during a compare operation when a high logic value is maintained on match line MATCH, and a no-match condition is indicated during a compare operation when match line $MATCH_1$ is discharged. In particular, at time t5, a high logic value (e.g., 1.5 Volts) is applied to inverted data line $D_1\#$, and a low logic value is applied to data line $D_1$ (FIGS. 6(D) and 6(C), respectively). The high logic value on inverted data line $D_1\#$ is passed by transistor 427, which is turned on by the high data value stored at node $N_1$. Accordingly, transistor 428 is turned on during a compare operation to open a discharge path between match line $MATCH_1$ and low match line $LM_1$, which is indicated by the low match line signal at time t5 (FIG. 6(A)). Note that if a logic 1 were applied on data lines $D_1$ and $D_1\#$, the resulting low value passed by transistor 427 would not turn on transistor 428, and match line $MATCH_1$ would remain at $V_{CCL}$.

FIG. 7 is a schematic diagram showing a CAM cell 100B in accordance with a second specific embodiment of the present invention. CAM cell 100B includes SRAM cell 111A, which is described above with reference to FIG. 4, and a comparator 121B that operates as described below. In addition to the different circuit structure provided by comparator 121B, CAM cell 100B differs from CAM cell 100A in that, instead of separate bit lines and data lines, a single pair of bit/data lines B/D# and B#/D are used to transmit data signals during both write and compare operations, as described below.

Referring to the lower portion of FIG. 7, comparator 121B includes n-channel transistors 721–724. Transistors 721 and 723 are connected in series between match line $MATCH_1$ and low match line $LM_1$, and transistors 722 and 724 are also connected in series between match line $MATCH_1$ and low match line $LM_1$. The gate terminal of transistor 721 is connected to bit/data line B#/D, and the gate terminal of transistor 723 is connected to node $N_1\#$. Therefore, during compare operations, transistors 721 and 723 are turned on to open a first path between match line $MATCH_1$ and low match line $LM_1$ only when a high applied data signal is transmitted on bit/data line B#/D and a high data signal is stored at node $N_1\#$. Similarly, the gate terminal of transistor 722 is connected to bit/data line B/D#, and the gate terminal of transistor 724 is connected to node $N_1$. Therefore, transistors 722 and 724 are turned on to open a second path between match line $MATCH_1$ and low match line $LM_1$ only when a high applied data signal is transmitted on bit/data line B/D# and a high data signal is stored at node $N_1$.

In accordance with another aspect of the present invention, shared bit/data lines B#/D and B/D# are controlled using either the higher memory or lower logic operating voltages (i.e., either $V_{CCM}$ or $V_{CCL}$) during memory operations, and using the logic operating voltage (i.e., $V_{CCL}$) during logic (e.g., compare) operations. For example, in order to write a logic "1" to SRAM cell 111A, a high operating voltage (e.g., either 1.2 or 2.5 Volts) is transmitted on bit/data line B/D# (shown using dashed lines in FIG. 8(A)) between time t2 and t4, and a low voltage (e.g., 0 Volts) is transmitted on bit/data line B#/D (shown in FIG. 8(B)). Similar to the example described above with reference to FIGS. 5(B) and 5(C), when word line $WL_1$ is subsequently turned on, the operating voltage transmitted on bit/data line B/D# is passed to the latch formed by transistors 411 through 414 of SRAM cell 111A, thereby storing a high data signal at node $N_1$ and a low data signal at inverted node $N_1\#$. Subsequently, during a compare operation in which the logic "1" stored in SRAM cell 111A is compared with a logic "0", a relatively low operating voltage (e.g., 1.5 Volts) is transmitted on bit/data line B/D# (shown in FIG. 8(A)) between time t4 and t6, and a low voltage (e.g., 0 Volts) is transmitted on bit/data line B#/D (shown in FIG. 8(B)). As in the example described above embodiment, the match line is controlled using the relatively low logic operating voltage $V_{CCL}$. Similar to the example described above with reference to FIGS. 5(B) and 5(C), the relatively low operating voltage transmitted on bit/data line B/D# turns on transistor 722, and the high signal stored at node $N_1$ turns on transistor 724, thereby opening a discharge path between match line $MATCH_1$ and low match line $LM_1$. Therefore, the operation of CAM cell 100B is similar to that of CAM cell 100A (described above), but a CAM circuit incorporating an array of CAM cells 100B can be made smaller than a CAM circuit using CAM cells 100A because memory and logic operations are performed using a single pair of complementary bit/data lines, instead of the four lines used to operate CAM cell 100A.

Figure 9:
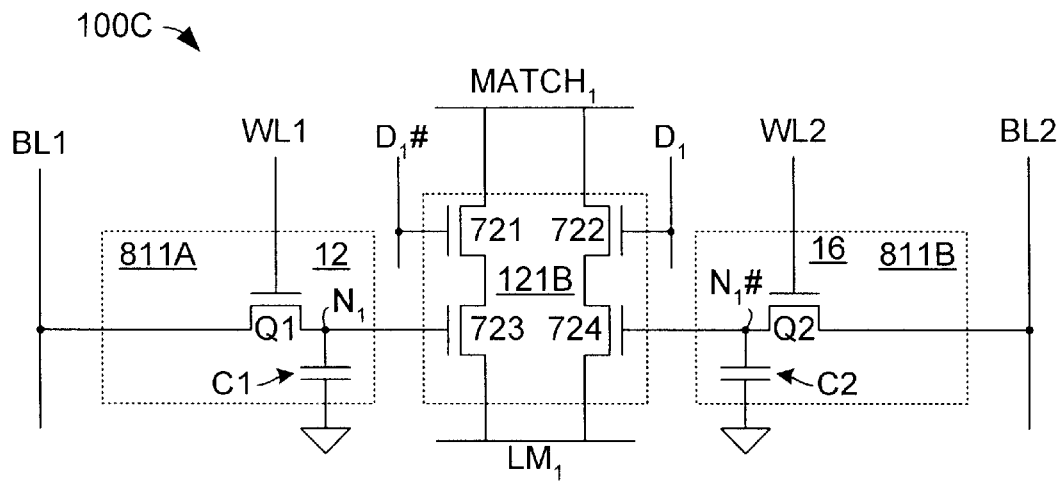
FIG. 9 is a schematic diagram showing a CAM cell of a CAM array according to a third specific embodiment of the present invention.
Figure 10A:
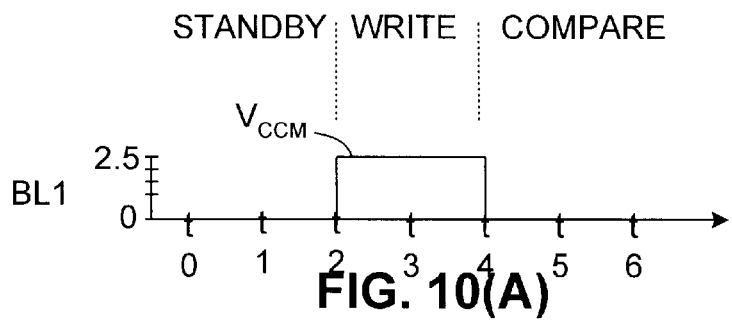
FIGS. 10(A) through 10(D) are timing diagrams depicting simplified bit and word line operations of the CAM cell shown in FIG. 9.
Figure 10B:
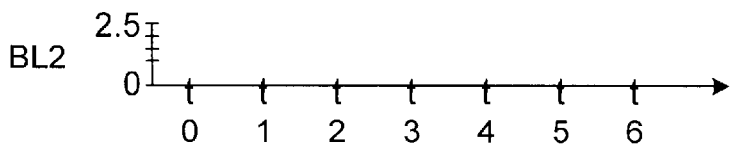
Figure 10C:
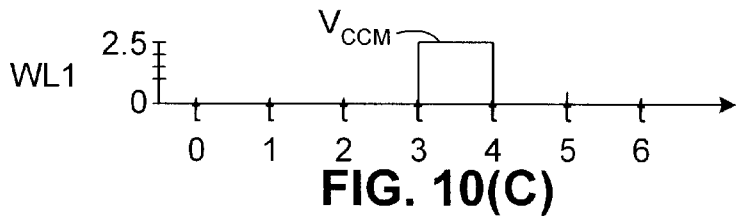
Figure 10D:
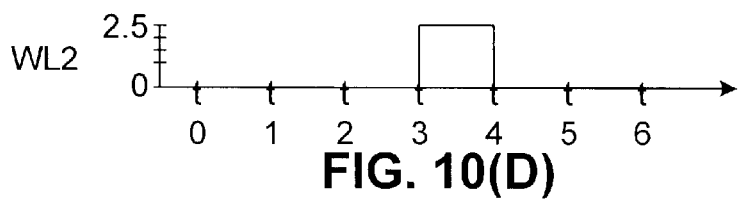

FIG. 9 is a schematic diagram showing a portion of a ternary DRAM-based CAM circuit includes an array of ternary CAM cells 100C (one shown) that is formed and operated in accordance with a third specific embodiment of the present invention. CAM cell 100C includes a first one-transistor (1T) DRAM cell 811A, a second 1T DRAM cell 811B, and logic circuit 121B (described above with reference to FIG. 7). DRAM cell 811A includes transistor Q1 and a capacitor structure C1, which combine to form a storage node $N_1$ that receives a data value from bit line BL1 during write operations, and applies the stored data value to the gate terminal of transistor 723 of comparator circuit 121B. DRAM cell 811B includes transistor Q2 and a capacitor structure C2, which combine to form a storage node $N_1\#$ that receives a data value from bit line BL2, and applies the stored data value to the gate terminal of transistor 724 of comparator circuit 121B.

The operation of CAM cell 100C is similar to that described above, with the exception that a "don't care" state is stored when both DRAM cells 811A and 811B store logic low data values, thereby preventing discharge of match line $MATCH_1$ no matter what data values are transmitted on data lines $D_1$ and $D_1\#$. Further, because DRAM cells 811A and 811B are not coupled to an independent voltage source, as in the SRAM-based examples provided above, logic "1" data signals are transmitted to and stored in DRAM cells 811A and 811B by maintaining bit line BL1 or BL2 depending on the data value being written) at memory voltage source $V_{CCM}$ (e.g., 2.5 Volts) during the write operation, and then turning on word lines WL1 and WL2, also using memory voltage source $V_{CCM}$. For example, as indicated in FIGS. 10(A) through 10(D), to write a logic "1" to CAM cell 100C, bit line BL1 is pulled up to memory voltage source $V_{CCM}$ at time t2 (bit line BL2 is maintained at $V_{SS}$), and word lines WL1 and WL2 are pulled up to memory voltage $V_{CCM}$ at time t3, thereby transferring voltage $V_{CCM\ to\ storage\ node\ N1}$. As in the SRAM-based embodiments described above, the relatively high stored voltage $V_{CCM}$ facilitates resistance to soft error discharge. Subsequently, during the compare operation, data lines $D_1$ and $D_1\#$, match line $MATCH_1$ and low match line $LM_1$ are driven using logic voltage source $V_{CCL}$.

Figure 11:
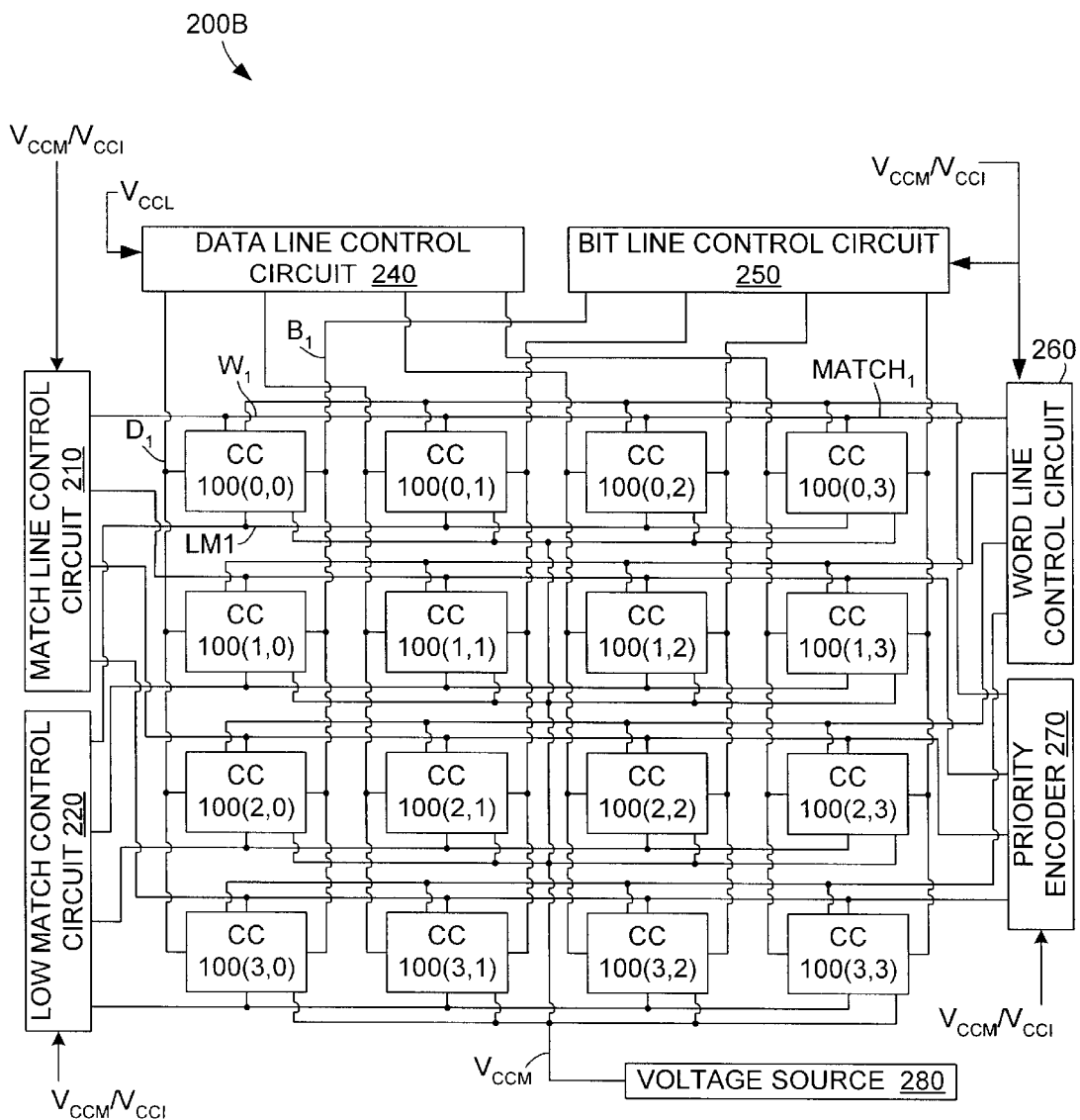
FIG. 11 is a block diagram showing a portion of a CAM circuit according to another embodiment the present invention.
Figure 12:
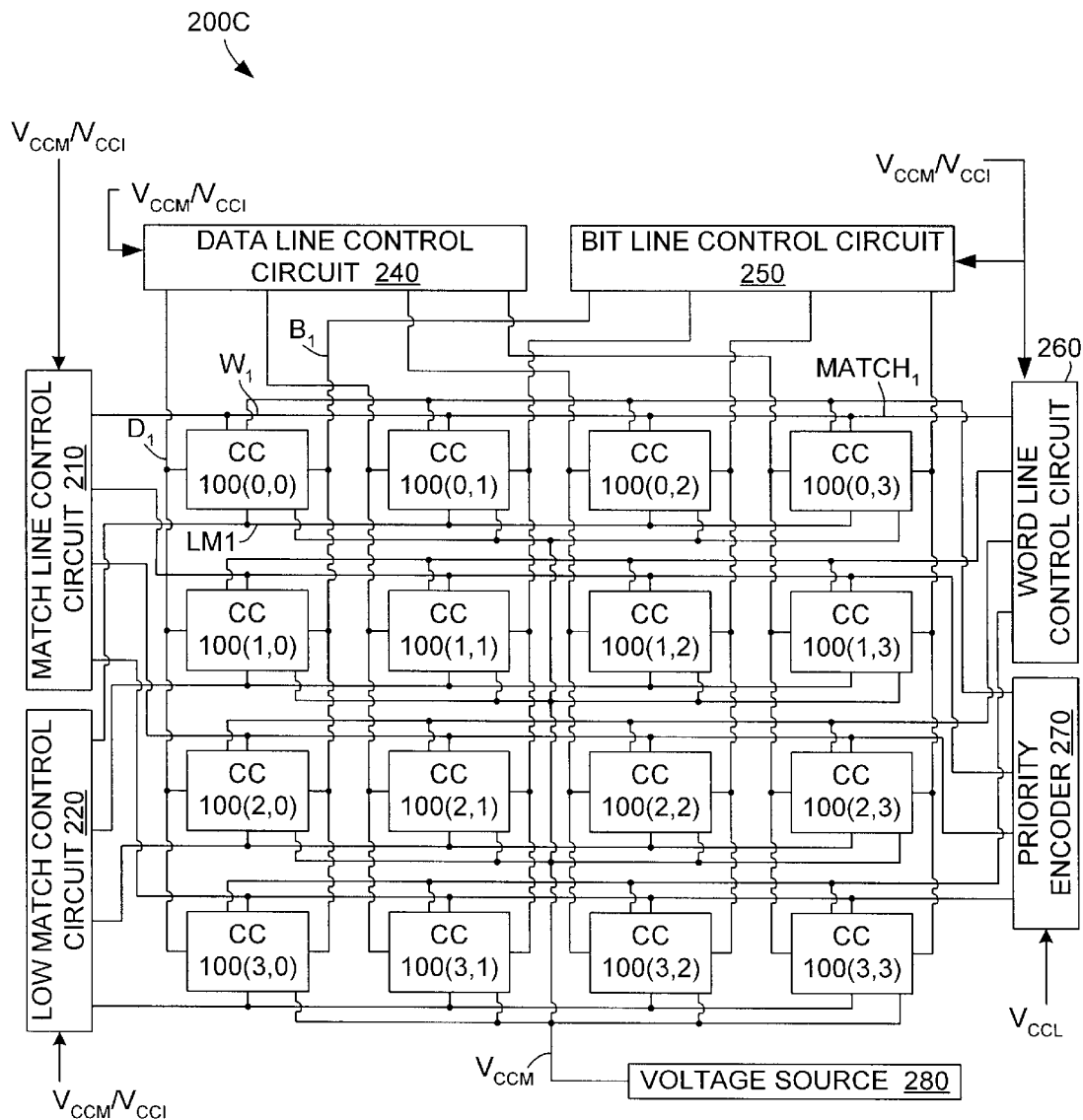
FIG. 12 is a block diagram showing a portion of a CAM circuit according to yet another embodiment the present invention.

Although the present invention is described with reference to certain binary SRAM CAM cells and ternary DRAM CAM cells, several alternative embodiments also fall within the spirit and scope of the invention. For example, the four-transistor comparator 121B (FIGS. 7 and 9) can be utilized in place of the three-transistor comparator 121A of CAM cell 100A (FIG. 4). Similarly, the three-transistor comparator 121A (FIG. 4) can be utilized in place of the four-transistor comparator 121B of CAM cells 100B and 100C (FIGS. 7 and 9). Further, the SRAM CAM circuits disclosed herein can be modified to include ternary and quad (four-state) SRAM CAM cells by including one or more additional SRAM cells in each CAM cell according to known techniques. Similarly, the DRAM CAM circuit disclosed herein can be modified to implement a binary or and quad DRAM CAM cells. Moreover, as suggested above, power consumption can be reduced by utilizing the relatively low logic operating voltage $V_{CCL}$ to drive portions of logic control circuit 140 other than match line control circuit 210, while driving other portions of the CAM circuit using relatively high memory operating voltage $V_{CCM}$ or intermediate operating voltage $V_{CCI}$. For example, FIG. 11 shows a CAM circuit 200B in which data line control circuit 240 is driven using the relatively low logic operating voltage $V_{CCL}$, while match line control circuit 210, low match control circuit 220, and priority encoder 270 are driven using the relatively high memory operating voltage $V_{CCM}$ or intermediate operating voltage $V_{CCI}$. Similarly, FIG. 12 shows a CAM circuit 200C in which priority encoder circuit 270 is driven using the relatively low logic operating voltage $V_{CCL}$, while match line control circuit 210, low match control circuit 220, and data line control 240 are driven using the relatively high memory operating voltage $V_{CCM}$ or intermediate operating voltage $V_{CCI}$. While the embodiments depicted in FIGS. 12 and 13 do not maximize the power conservation achieved when all of the logic control circuits are driven using logic operating voltage $V_{CCL}$, at least some reduction is achieved using the arrangements illustrated in FIGS. 12 and 13. In view of these and other possible modifications, the invention is limited only by the following claims.

What is claimed is:

1. A content addressable memory (CAM) circuit comprising:
   a plurality of CAM cells, each CAM cell including:
   a memory cell having a storage node for storing a first data value, said memory cell being connected to a first operating voltage, and
   a logic portion including a comparator for receiving the first data value from the memory cell and a second data value transmitted on an associated data line during a compare operation;
   a match line coupled to the plurality of memory cells; and
   a match line control circuit for controlling a voltage signal transmitted on the match line, said match line control circuit being connected to a second operating voltage,
   wherein the first operating voltage is greater than the second operating voltage.

2. The CAM circuit according to claim 1, wherein said match line control circuit comprises means for selectively coupling the match line to the second operating voltage before a compare operation.

3. The CAM circuit according to claim 2, further comprising:
   a discharge line coupled to the plurality of memory cells; and
   a low match control circuit for pulling the discharge line to a predetermined low voltage level during the compare operation.

4. The CAM circuit according to claim 3, wherein the low match control circuit is connected to the second operating voltage.

5. The CAM circuit according to claim 1, further comprising sensing means for measuring the voltage signal transmitted on the match line during the compare operation, wherein said sensing means is connected to the second operating voltage.

6. The CAM circuit according to claim 1, further comprising:
a data line control circuit for controlling voltage signals transmitted on the associated data lines to the logic portions of the plurality of CAM cells,
wherein the data line control circuit is connected to the second operating voltage.

7. The CAM circuit according to claim 6, wherein said data line control circuit comprises means for selectively coupling the associated data lines to the second operating voltage.

8. The CAM circuit according to claim 1, further comprising:
a plurality of bit lines, each bit line being connected to an associated memory cell of the plurality of CAM cells; and
a bit line control circuit for controlling voltage signals transmitted on the plurality of bit lines.

9. The CAM circuit according to claim 8, wherein the bit line control circuit is connected to the second operating voltage.

10. The CAM circuit according to claim 9, wherein said bit line control circuit comprises means for selectively coupling the plurality of bit lines to the second operating voltage.

11. The CAM circuit according to claim 8, wherein the bit line control circuit is connected to the first operating voltage.

12. The CAM circuit according to claim 11, wherein said bit line control circuit comprises means for selectively coupling the plurality of bit lines to the first operating voltage.

13. The CAM circuit according to claim 8, wherein the bit line control circuit is connected to a third operating voltage, the third operating voltage being greater than the second operating voltage, and less than the first operating voltage.

14. The CAM circuit according to claim 13, wherein said bit line control circuit comprises means for selectively coupling the plurality of bit lines to the third operating voltage.

15. The CAM circuit according to claim 1, further comprising:
a word line connected to the memory cells of the plurality of CAM cells; and
a word line control circuit for controlling a voltage signal transmitted on the word line.

16. The CAM circuit according to claim 15, wherein the word line control circuit is connected to the second operating voltage.

17. The CAM circuit according to claim 16, wherein the data line control circuit comprises means for selectively coupling the word line to the second operating voltage.

18. The CAM circuit according to claim 15, wherein the word line control circuit is connected to the first operating voltage.

19. The CAM circuit according to claim 18, wherein the word line control circuit comprises means for selectively coupling the word line to the first operating voltage.

20. The CAM circuit according to claim 15, wherein the word line control circuit is connected to a third operating voltage, the third operating voltage being greater than the second operating voltage, and less than the first operating voltage.

21. The CAM circuit according to claim 20, wherein the word line control circuit comprises means for selectively coupling the word line to the third operating voltage.

22. A content addressable memory (CAM) circuit comprising:
a plurality of data lines;
a plurality of CAM cells, each CAM cell including:
a memory cell having a storage node for storing a first data value, said memory cell being connected to a first operating voltage, and
a logic portion including a comparator for receiving the first data value from the memory cell and a second data value transmitted on an associated data line of the plurality of data lines during a compare operation; and
data line control circuit for controlling voltage signals transmitted on the plurality of data lines,
wherein the data line control circuit is connected to a second operating voltage, and
wherein the first operating voltage is greater than the second operating voltage.

23. The CAM circuit according to claim 22, wherein said data line control circuit comprises means for selectively coupling the associated data lines to the second operating voltage.

24. A content addressable memory (CAM) circuit comprising:
a plurality of CAM cells, each CAM cell including:
a memory cell having a storage node for storing a first data value, said memory cell being connected to a first operating voltage, and
logic portion including a comparator for receiving the first data value from the memory cell and a second data value transmitted on an associated data line during a compare operation;
a match line coupled to the plurality of memory cells; and
sensing means for measuring the voltage signal transmitted on said match line, said sensing means being connected to a second operating voltage, and
wherein the first operating voltage is greater than the second operating voltage.

25. A content addressable memory (CAM) circuit comprising:
a plurality of DRAM CAM cells, each CAM cell including:
a memory cell having a storage node for storing a first data value, and
a logic portion including a comparator for receiving the first data value from the memory cell and a second data value transmitted on an associated data line during a compare operation;
a plurality of bit lines, each bit line being connected to an associated memory cell of the plurality of CAM cells;
a bit line control circuit for controlling voltage signals transmitted on the plurality of bit lines;
a match line coupled to the plurality of memory cells; and
a match line control circuit for controlling a voltage signal transmitted on the match line,
wherein the bit line control circuit is connected to a first operating voltage,
wherein the match line control circuit is connected to a second operating voltage, and
wherein the first operating voltage is greater than the second operating voltage.

26. The CAM circuit according to claim 25, wherein said bit line control circuit comprises means for selectively coupling the plurality of bit lines to the first operating voltage.

* * * * *